United States Patent [19]

Shiga

[11] Patent Number: 5,631,479
[45] Date of Patent: May 20, 1997

[54] SEMICONDUCTOR DEVICE WITH LAMINATED REFRACTORY METAL SCHOTTKY BARRIER GATE ELECTRODE

[75] Inventor: Toshihiko Shiga, Itami, Japan

[73] Assignee: Mitsubishi Denki Kabushiki Kaisha, Tokyo, Japan

[21] Appl. No.: 567,991

[22] Filed: Dec. 4, 1995

[30] Foreign Application Priority Data

Apr. 26, 1995 [JP] Japan ................................. 7-102353

[51] Int. Cl.$^6$ ......................... H01L 29/80; H01L 31/112
[52] U.S. Cl. .................. 257/280; 257/281; 257/284; 257/745; 257/750; 257/757
[58] Field of Search ............................. 257/268, 280, 257/281, 284, 734, 743, 744, 745, 750, 757, 761, 763, 764, 768, 770

[56] References Cited

U.S. PATENT DOCUMENTS 4,179,533  12/1979  Christou et al. ................. 257/750

FOREIGN PATENT DOCUMENTS 60-132375  7/1985  Japan.
61-290775  12/1986  Japan.

*Primary Examiner*—Carl W. Whitehead, Jr.
*Attorney, Agent, or Firm*—Leydig, Voit & Mayer

[57] ABSTRACT

A semiconductor device includes a semiconductor substrate having a surface; an active layer of a compound semiconductor disposed at the surface of the semiconductor substrate; and a Schottky barrier gate electrode including a multi-layer film alternately laminating a conductive refractory metal compound layer including a first refractory metal ($M_1$) and a second refractory metal ($M_2$) layer to three or more layers respectively, disposed on the active layer, thereby forming a Schottky junction with the active layer. The gate resistance of the Schottky barrier gate electrode can be held low and the internal stress can be reduced, whereby peeling off of the can be suppressed.

6 Claims, 5 Drawing Sheets

SEMICONDUCTOR DEVICE WITH LAMINATED REFRACTORY METAL SCHOTTKY BARRIER GATE ELECTRODE

FIELD OF THE INVENTION

The present invention relates to a semiconductor device such as a field effect transistor provided with a Schottky barrier electrode on a compound semiconductor substrate, or an MMIC (microwave monolithic integrated circuit) or a logic IC using this MESFET.

BACKGROUND OF THE INVENTION

Conventionally, as a gate electrode of a GaAs MESFET having a self-aligned structure due to ion implantation, a refractory metal such as W (tungsten) or a refractory metal silicide such as $WSi_x$ (tungsten silicide) is widely used.

Among those, $WSi_x$ is superior in the characteristics of the Schottky junction formed with GaAs as well as stability against thermal processing after the formation of the junction, and is well applied as a gate electrode of a GaAs MESFET.

However, because $WSi_x$ has a high resistivity, for example, about 150 µΩ·cm when x=0.3, when it is adopted as a gate electrode of a GaAs MESFET, the gate resistance would be unfavorably increased.

FIG. 6 is a diagram illustrating a cross-section of a GaAs MESFET disclosed in Japanese Published Patent Application No. Sho. 60-132375. MESFET has superior Schottky characteristics with $WSi_x$ and the stability against thermal processing after forming the junction, and it is quite effective as means for reducing the gate resistance.

In FIG. 6, reference numeral 12 designates a semi-insulating GaAs substrate, numeral 13 designates an active layer comprising n type GaAs. Numeral 14 designates a first metal layer comprising $Ta_xW_ySi_{1-x-y}$, numeral 15 designates a second metal layer comprising $Ta_vW_zSi_{1-y-z}$. Numeral 16 designates a gate electrode, numeral 17 designates a source electrode, and numeral 18 designates a drain electrode. The gate electrode 16 comprises a double-layer structure comprising the first metal layer 14 and the second metal layer 15.

In the above-described two-layer structure, the gate resistance of the gate electrode 16 becomes the smallest when the first metal layer 14 comprises $WSi_x$ and the second metal layer 15 comprises W. Here, the value of x represents the minimum composition ratio that can produce superior Schottky characteristics in the Schottky junction which is obtained with the first metal layer 14 comprising $WSi_x$ contacting the active layer 13 comprising n type GaAs.

However, when the first metal layer 14 comprising $WSi_x$ and the second metal layer 15 comprising W are formed on the semi-insulating GaAs substrate 12, the internal stress arising in the first metal layer 14 and the second metal layer 15 becomes large, and as a result, it is likely to cause peeling at the interface between the first metal layer 14 and the active layer 13 on the semi-insulating GaAs substrate 12, thereby resulting in difficulty in forming the gate electrode stably.

SUMMARY OF THE INVENTION

It is an object of the present invention to provide a semiconductor device with a Schottky barrier gate electrode on a compound semiconductor substrate that has a reduced gate resistance of the Schottky barrier gate electrode, and further a reduced internal stress, which provide stable fabrication.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a semiconductor device comprises: a semiconductor substrate having a surface; an active layer comprising a compound semiconductor disposed on the surface of the semiconductor substrate; and a Schottky barrier gate electrode comprising a multi-layer film alternately laminating a conductive refractory metal compound layer including first refractory metal ($M_1$) and a second refractory metal ($M_2$) layer to three or more layers for respective material layers, disposed on the active layer, thereby forming a Schottky junction with the active layer. Therefore, the gate resistance of the Schottky barrier gate electrode can be held low and the internal stress can be reduced, whereby the peeling off can be suppressed.

According to a second aspect of the present invention, in the above-described semiconductor device, the first refractory metal ($M_1$) included in the conductive refractory metal compound layer comprises at least one selected among W, Mo, Ta, and Nb, and the second refractory metal ($M_2$) is one selected among W, Mo, Ta, and Nb.

According to a third aspect of the present invention, in the above-described semiconductor device, the conductive refractory metal compound layer comprises a silicide of the first refractory metal ($M_1$) ($M_1Si_x$, $0<x\leq1$).

According to a fourth aspect of the present invention, in the above-described semiconductor device, the conductive refractory metal compound layer comprises a silicide of the first refractory metal ($M_1$) ($M_1Si_x$, $0<x\leq1$).

According to a fifth aspect of the present invention, in the above-described semiconductor device, the conductive refractory metal compound layer comprises a silicide of the first refractory metal ($M_1$) including nitrogen ($M_1Si_xN_y$, $0<x$, $0<y$).

According to a sixth aspect of the present invention, in the above-described semiconductor device, the conductive refractory metal compound layer comprises a silicide of the first refractory metal ($M_1$) including nitrogen ($M_1Si_xN_y$, $0<x$, $0<y$).

According to a seventh aspect of the present invention, a method for fabricating a semiconductor device comprises: successively laminating, on an active layer comprising compound semiconductor, alternately a conductive refractory metal compound layer including first refractory metal ($M_1$) and a second refractory metal ($M_2$) layer to three or more layers for respective material layers using a dc magnetron sputtering, thereby forming a multi-layer film; and removing by etching a portion of the multi-layer film, thereby forming a Schottky barrier gate electrode having a Schottky characteristics on the active layer.

Therefore, a semiconductor device in which the gate resistance of the Schottky barrier gate electrode is held low and the internal stress is reduced, whereby the peeling off is suppressed, is fabricated.

According to an eighth aspect of the present invention, in the above-described fabricating method of a semiconductor device, the first refractory metal ($M_1$) included in the conductive refractory metal compound layer comprises at least one selected among W, Mo, Ta, and Nb, and the second refractory metal ($M_2$) is one selected among W, Mo, Ta, and Nb.

According to a ninth aspect of the present invention, in the above-described fabricating method of a semiconductor device, the conductive refractory metal compound layer comprises a silicide of the first refractory metal ($M_1$) ($M_1$) ($M_1Si_x$, $0<x\leq 1$).

According to a tenth aspect of the present invention, in the above-described fabricating method of a semiconductor device, the conductive refractory metal compound layer comprises a silicide of the first refractory metal ($M_1$) ($M_1Si_x$, $0<x\leq 1$).

According to an eleventh aspect of the present invention, in the above-described fabricating method of a semiconductor device, the conductive refractory metal compound layer comprises a silicide of the first refractory metal ($M_1$) including nitrogen ($M_1Si_xN_y$, $0<x$, $0<y$).

According to a twelfth aspect of the present invention, in the above-described fabricating method of a semiconductor device, the conductive refractory metal compound layer comprises a silicide of the first refractory metal ($M_1$) including nitrogen ($M_1Si_xN_y$, $0<x$, $0<y$)

DETAILED DESCRIPTION OF THE PREFERRED EMBODIMENTS

Embodiment 1.

Figure 1:
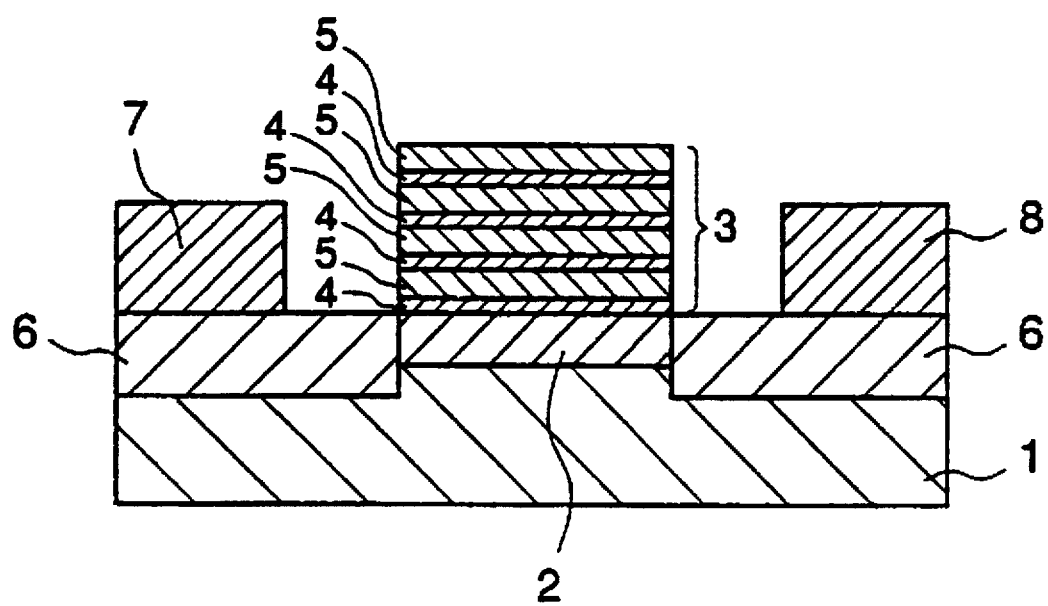
FIG. 1 is a cross-sectional view illustrating a semiconductor device according to a first embodiment of the present invention.

FIG. 1 is a cross-sectional view illustrating a MESFET (metal semiconductor field effect transistor) according to a first embodiment of the present invention and FIGS. 2(a)–2(d) are cross-sectional views illustrating the fabrication process for the semiconductor device.

In the figure, reference numeral 1 designates a compound semiconductor substrate comprising GaAs. Numeral 2 designates an n type GaAs active layer. Numeral 3 designates a Schottky barrier gate electrode, which comprises a laminated layer structure alternately laminating four $WSi_{0.3}$ layers 4 and four W layers 5. The active layer contacts one of the $WSi_{0.3}$ layers 4. Reference numeral 6 designates a high dopant impurity concentration impurity layer comprising $n^+$ type GaAs, and reference numerals 7 and 8 designate a source electrode and a drain electrode comprising AuGe/Ni/Au, respectively.

Next, a description is given of the fabricating method with reference to FIGS. 2(a)–2(d).

Figure 2:
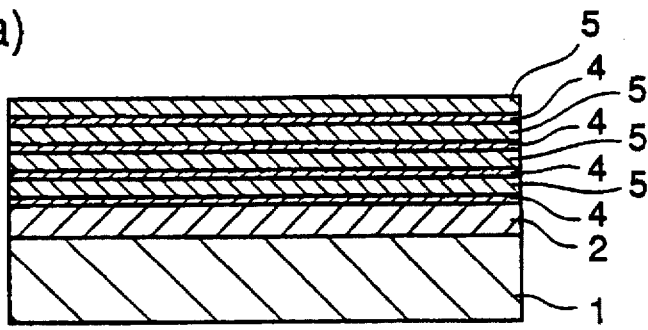
FIGS. 2(a)–2(d) are cross-sectional views illustrating a process for fabricating the semiconductor device according to the first embodiment.
Figure 2:
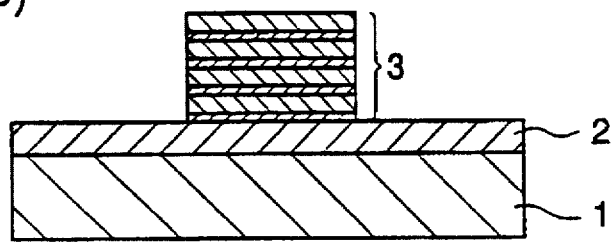
Figure 2:
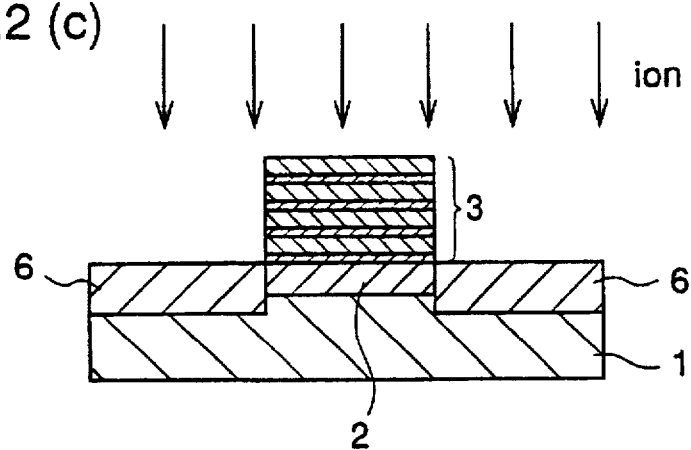
Figure 2:
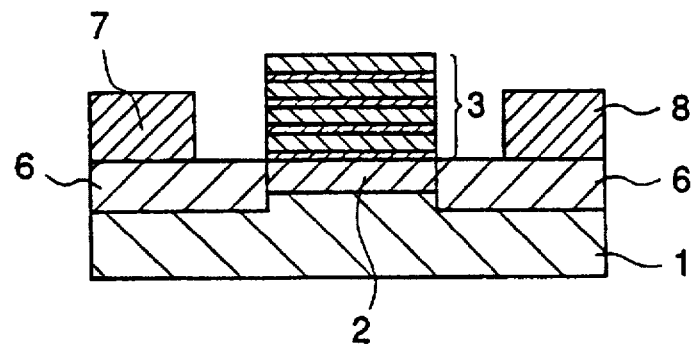

First of all, as shown in figure 1(a), an active layer 2 comprising n type GaAs is formed by ion implantation of Si into the compound semiconductor substrate 1 comprising GaAs. Thereafter, four $WSi_{0.3}$ layers 4 and four W layers 5 are successively alternately laminated in a vacuum chamber using dc magnetron sputtering, thereby forming a multilayer film. The thickness of each $WSi_{0.3}$ layer 4 is 37.5 nm and the thickness of each W layer 5 is 62.5 nm, and the thickness ratio of the $WSi_{0.3}$ layer 4 to the W layer 5 is 3:5. The total thickness of the $WSi_{0.3}$ layers 4 and the W layers 5 is about 400 nm. The layer in contact with the active layer 2 is a $WSi_{0.3}$ layer 4. Next, a portion of the multi-layer film is removed by a dry etching such as ECR plasma etching, whereby a Schottky barrier gate electrode 3 receiving a multi-layered film structure is formed, as shown in FIG. 2(b). Next, by the self-alignment process using an ion implantation, Si is implanted to a high concentration to form a high dopant concentration impurity layer 6 comprising $n^+$ type GaAs and, then, a source electrode 7 and a drain electrode 8, both comprising AuGe/Ni/Au are formed. Thereafter, in order to activate the high concentration impurity layer 6, annealing is performed at a temperature of 800° C. for thirty minutes as a high temperature process.

According to the above-described construction and fabricating method, the sheet resistance of the multi-layered film comprising the $WSi_{0.3}$ layers 4 and the W layers 5 becomes about 600 m$\Omega$/□. The resistivity of the multi-layered film, when assumed to be of a homogeneous structure, is about 24 $\mu\Omega$·cm, less than about ⅙ the resistivity of the single layered film of 150 $\mu\Omega$·cm, whereby the gate resistance can be eminently reduced.

Figure 3:
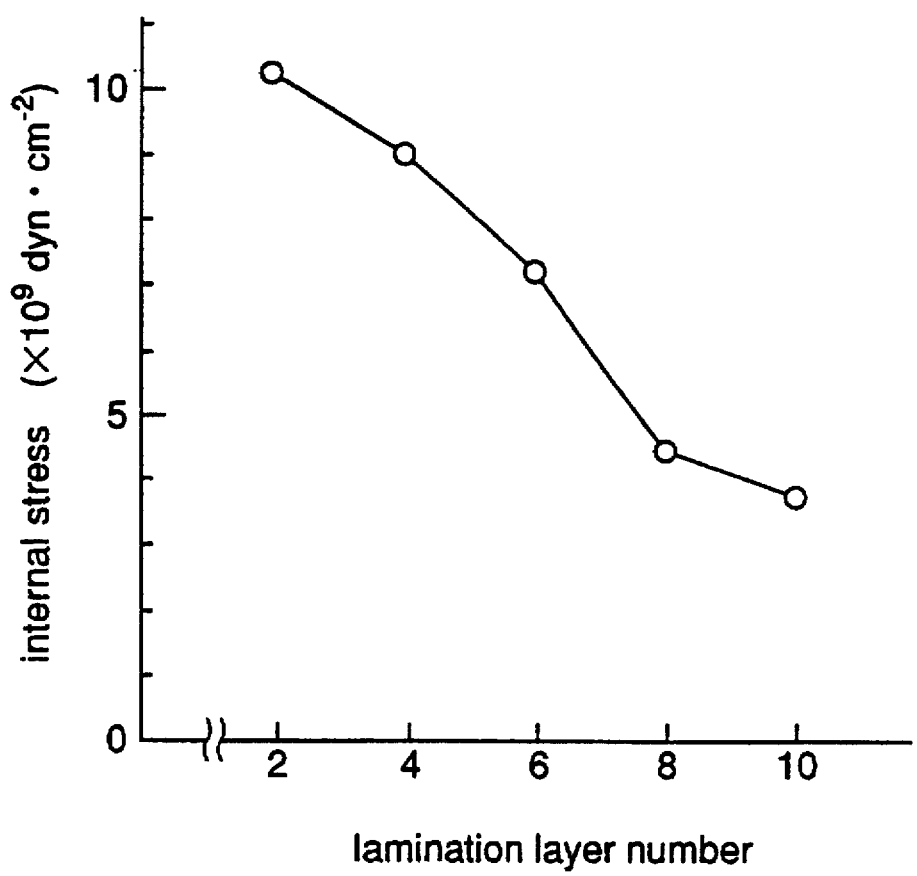
FIG. 3 is a diagram illustrating the laminated layer number dependency of the internal stress in the multi-layer film.

In addition, the internal stress of the multi-layered film of the eight layers comprising four $WSi_{0.3}$ layers 4 and four W layers 5 becomes a small tensile stress of about $4.5\times 10^9$ dyn·cm$^2$, whereby peeling off of the multi-layered film from the interface with the active layer 2 can be suppressed. FIG. 3 shows a result of investigation of the laminated layer dependency of the internal stress in the multi-layered film. From FIG. 3, as the laminated layer number increases, the internal stress of the laminated structure is reduced, whereby the internal stress can be reduced by making the number of laminated layers number to more than three.

In addition, the Schottky barrier height of the Schottky barrier gate electrode 3 after the high temperature processing is performed is about 0.7 eV, which is approximately equal to a value which is obtained in a case where a single layer of $WSi_{0.3}$ is employed.

As described above, the Schottky barrier gate electrode 3 on the active layer 2 is made by laminating more than three layers of both $WSi_{0.3}$ layer 4 and W layers 5 alternately, thereby maintaining a low gate resistance of the Schottky barrier gate 3 as well as suppressing the peeling off of the pate electrode.

While in the above-described embodiment, $WSi_{0.3}$ is employed as the conductive refractory metal compound layer including the first refractory metal, $WSi_x$ ($0<x\leq 1$) can be used therefor with the same effects as described above.

In addition, the lamination layer dependency of the internal stress of the multi-layer film when the values of the film thicknesses and the film thickness ratio of the $WSi_{0.3}$ layer 4 and the W layer 5 are varied has been investigated. It was found that the internal stress can be reduced by employing a lamination layer structure of three or more layers, as shown in FIG. 3.

In addition, the Schottky barrier gate electrode (3) may be made of a lamination layer structure of three or more layers comprising a silicide of a first refractory metal ($M_1$) including at least one of Mo, Ta, and Nb, and the second refractory metal ($M_2$) may be made of at least one of Mo, Ta, and Nb, with the same effects as described above.

Embodiment 2.

Figure 4:
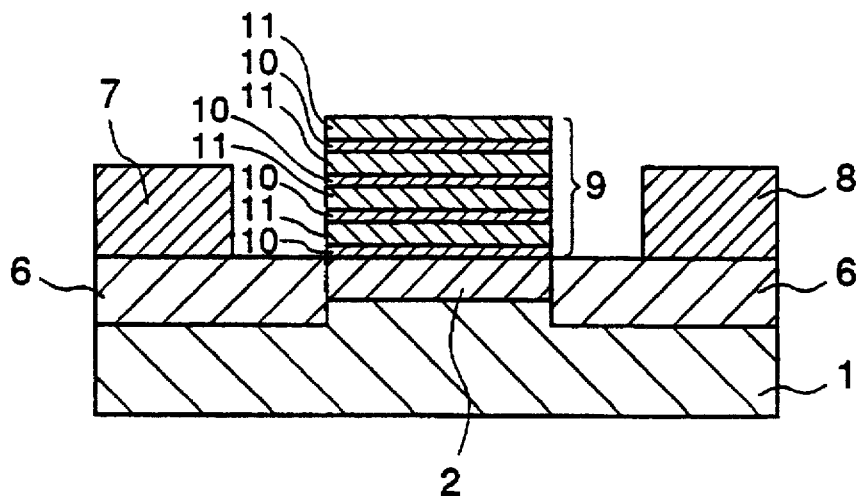
FIG. 4 is a cross sectional view of a semiconductor device according to a second embodiment of the present invention.

FIG. 4 is a cross-sectional view illustrating a MESFET according to a second embodiment of the present invention.

In the figure, reference numeral 1 designates a compound semiconductor substrate comprising GaAs. Numeral 2 designates an active layer comprising n type GaAs. Numeral 9 designates a Schottky barrier gate electrode comprising four $WSi_xN_y$ ($0<x$, $0<y$) layers 10 and four W layers 11 laminated alternately in which a $WSi_xN_y$ layer 10 is in contact with the active layer 2. Numeral 6 designates an $n^+$ type GaAs high dopant impurity concentration layer and numerals 7 and 8 designate a source electrode and a drain electrode, respectively, both comprising AuGe/Ni/Au. In this embodiment, one of the layers 10 and 11 forming the Schottky barrier gate electrode 9 comprises a tungsten silicide including nitrogen, i.e., $WSi_xN_y$.

Figure 5:
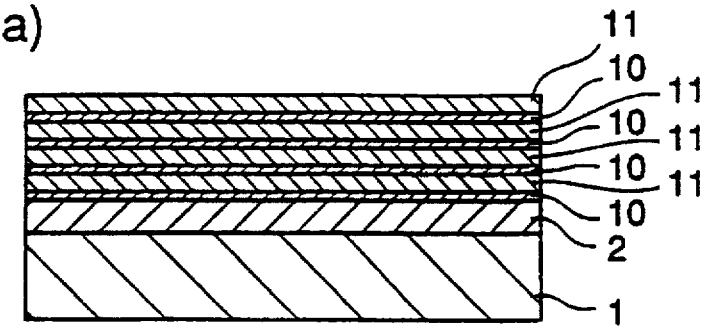
FIGS. 5(a)–5(d) are cross sectional views illustrating a process for fabricating the semiconductor device according to the second embodiment.
Figure 5:
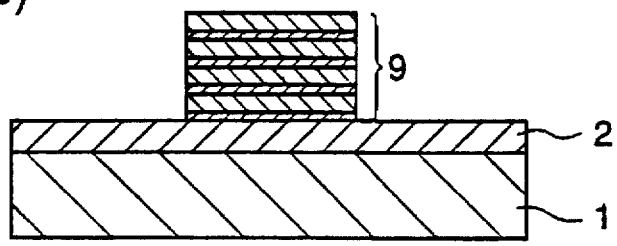
Figure 5:
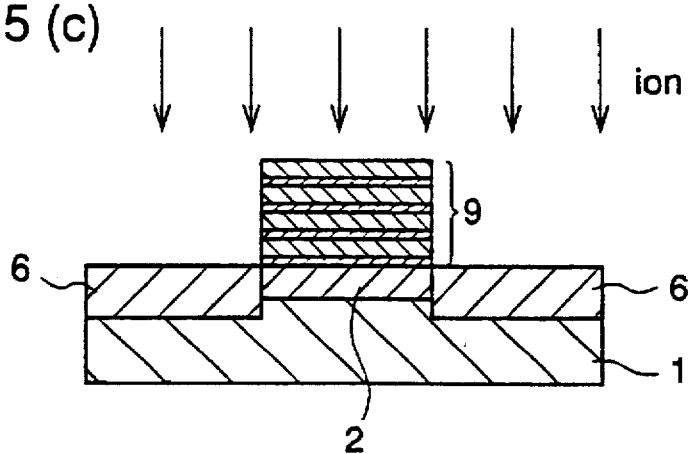
Figure 5:
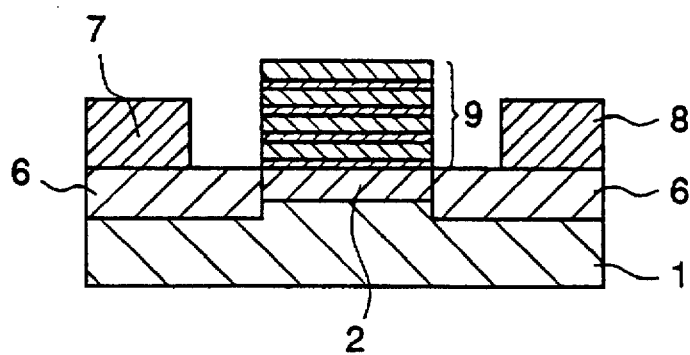
Figure 6:
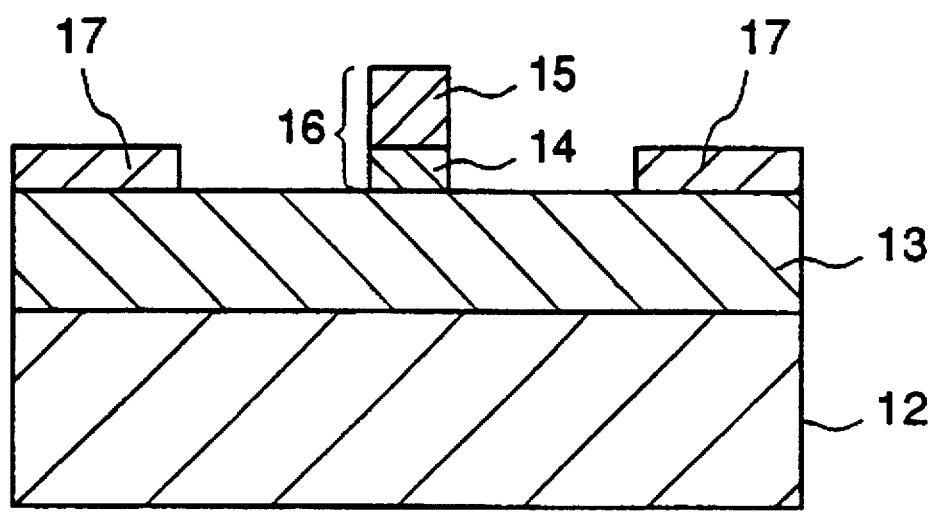
FIG. 6 is a cross-sectional view illustrating a prior art GaAs MESFET.

A description is given of the fabricating method of the above-described semiconductor device with reference to FIGS. 5(a)–5(d). First of all, as shown in FIG. 5(a), on the compound semiconductor substrate 1 comprising GaAs, an active layer 2 comprising n type GaAs is formed by ion implanting Si to form an active layer 2 and, thereafter, employing dc magnetron sputtering, four $WSi_xN_y$ layers 10 and four W layers 11 are alternately successively laminated in a vacuum chamber, thereby forming a multi-layer film. The thickness of each $WSi_xN_y$ layer 10 is 37.5 nm and the thickness of the W layer 11 is 62.5 nm, and the thickness ratio between each $WSi_xN_y$ layer 10 and the W layer 11 is 3:5. The total thickness of the multi-layer film comprising the four $WSi_xN_y$ layers 10 and the four W layers 11 is 400 nm. In addition, the layer which is in contact with the active layer 2 is a $WSi_xN_y$ layer 10.

Next, a portion of the multi-layer film is removed by dry etching such as ECR plasma etching, whereby the Schottky barrier gate electrode 9 having a multi-layer film structure is formed, as shown in FIG. 5(b).

Next, Si is implanted into the active layer 2 by a self-alignment process using ion implantation, thereby forming the high dopant impurity concentration layer 6 comprising $n^+$ type GaAs, as shown in FIG. 5(c) and, then, heating is performed at 800° C. for 30 minutes. Thereafter, by employing an evaporation and lift off process using a resist mask, the source electrode 7 and the drain electrode 8, both comprising AuGe/Ni/Au, are formed on the active layer 2.

According to the above-described device and fabricating method, the internal stress of the Schottky barrier gate electrode 9 can be reduced and as the peeling off at the interface with the active layer 2 can be suppressed and, even though the gate resistance is slightly larger than that of the laminating structure comprising $WSi_x$ and W described in the first embodiment, the gate resistance can be made smaller than that comprising the $WSi_x$ single layer.

In the above-described embodiment, the thickness of each $WSi_xN_y$ layer 10 is 37.5 nm, the thickness of each W layer 11 is 62.5 nm, and the thickness ratio between the $WSi_xN_y$ layer 10 and the W layer 11 is 3:5. However, as a result of having investigated the laminated layer number dependency of the internal stress of the multi-layer film, as in FIG. 3, the internal stress of the multi-layer film can be reduced by making a laminated layer structure of three or more layers.

In addition, the Schottky barrier gate electrode 9 may be made of a laminated layer structure of three or more layers comprising a silicide of a first refractory metal ($M_1$) including at least one of Mo, Ta, and Nb and a second refractory metal ($M_2$) comprising at least one of Mo, Ta, and Nb, with the same effects as described above.

In addition, while in the above-described first and second embodiments, an active layer 2 comprising n type GaAs is formed by ion implanting Si into the compound semiconductor substrate 1, the active layer 2 may comprise an n type GaAs layer laminated on the compound semiconductor substrate 1.

While in the above-described first and second embodiments the active layer 2 comprises n type GaAs, an active layer may comprise another III–V group compound semiconductor, with the same effects as described above.

In addition, the above-described MESFETs in the first and the second embodiments may be applied to semiconductor devices such as MMICs or logic ICs.

According to the present invention, a semiconductor device includes a semiconductor substrate; an active layer comprising a compound semiconductor; and a Schottky barrier gate electrode comprising a multi-layer film comprising a conductive refractory metal compound layer including a first refractory metal ($M_1$), and a second refractory metal ($M_2$) alternately laminated to three or more layers, disposed on the active layer. Therefore, the gate resistance of the Schottky barrier gate electrode can be kept low and the internal stress thereof is reduced, whereby the peeling off of the gate electrode is suppressed.

What is claimed is:

1. A semiconductor device comprising:
    a semiconductor substrate having a surface;
    an active layer comprising a compound semiconductor disposed at the surface of the semiconductor substrate; and
    a Schottky barrier gate electrode disposed on and forming a Schottky barrier with the active layer, the Schottky barrier gate electrode comprising a multi-layer film including, alternatingly laminated, (i) electrically conductive refractory metal silicide layers including a refractory metal ($M_2$) and (ii) refractory metal layers including a refractory metal ($M_2$), the Schottky barrier gate electrode including at least three of each of the refractory metal silicide and refractory metal layers.

2. The semiconductor device of claim 1, wherein the refractory metal ($M_1$) is selected from the group consisting of W, Mo, Ta, and Nb, and the refractory metal ($M_2$) is selected from the group consisting of W, Mo, Ta, and Nb.

3. The semiconductor device of claim 1, wherein the conductive refractory metal silicide layers include nitrogen.

4. The semiconductor device of claim 2, wherein the conductive refractory metal silicide layers include nitrogen.

5. The semiconductor device of claim 1, wherein one of the conductive refractory metal silicide layers directly contacts the active layer.

6. The semiconductor device of claim 2, wherein one of the conductive refractory metal silicide layers directly contacts the active layer.

* * * * *

UNITED STATES PATENT AND TRADEMARK OFFICE
CERTIFICATE OF CORRECTION

PATENT NO. : 5,631,479
DATED : May 20, 1997
INVENTOR(S) : Shiga

It is certified that error appears in the above-indentified patent and that said Letters Patent is hereby corrected as shown below:

Column 6, Line 40, change "$(M_2)$" to --$(M_1)$--.

Signed and Sealed this

Ninth Day of September, 1997

Attest:

BRUCE LEHMAN

Attesting Officer     Commissioner of Patents and Trademarks